(12) United States Patent
Kotani

(10) Patent No.: US 7,808,049 B2
(45) Date of Patent: Oct. 5, 2010

(54) SEMICONDUCTOR DEVICE

(75) Inventor: Naoki Kotani, Hyogo (JP)

(73) Assignee: Panasonic Corporation, Osaka (JP)

( * ) Notice: Subject to any disclaimer, the term of this patent is extended or adjusted under 35 U.S.C. 154(b) by 224 days.

(21) Appl. No.: 11/491,259

(22) Filed: Jul. 24, 2006

(65) Prior Publication Data

US 2007/0063286 A1    Mar. 22, 2007

(30) Foreign Application Priority Data

Sep. 20, 2005    (JP) .............................. 2005-272455

(51) Int. Cl.
*H01L 29/76*    (2006.01)
(52) U.S. Cl. ............... 257/365; 257/E29.266; 257/E25.016; 257/E25.026
(58) Field of Classification Search ................. 257/365, 257/E29.266, E25.016, E25.026
See application file for complete search history.

(56) References Cited

U.S. PATENT DOCUMENTS

| | | | |
|---|---|---|---|
| 5,844,836 A * | 12/1998 | Kepler et al. ................ | 365/156 |
| 6,174,822 B1 * | 1/2001 | Nagano et al. .............. | 438/763 |
| 2004/0029323 A1 | 2/2004 | Shimizu et al. | |
| 2004/0178516 A1 | 9/2004 | Ogata | |
| 2004/0217448 A1 | 11/2004 | Kumagai et al. | |
| 2006/0189075 A1 | 8/2006 | Kanno | |

FOREIGN PATENT DOCUMENTS

| | | |
|---|---|---|
| JP | 2003-273240 A | 9/2003 |
| JP | 2004-087640 | 3/2004 |
| JP | 2004-273972 | 9/2004 |
| JP | 2006-237070 | 9/2006 |
| WO | WO 02/43151 A1 | 5/2002 |

OTHER PUBLICATIONS

Shimizu, "Local Mechanical-Stress Control (LMC): A New Technique for CMOS-Performance Enhancement", IEEE, 2001.*
Japanese Notice of Reasons for Rejection w/ English translation thereof, issued in Japanese Patent Application No. 2005-272455 dated Apr. 6, 2010.

* cited by examiner

*Primary Examiner*—Wael M Fahmy
*Assistant Examiner*—Tucker Wright
(74) *Attorney, Agent, or Firm*—McDermott Will & Emery LLP

(57) ABSTRACT

In a semiconductor device, a transistor in an N-type logic region NL is covered with a tensile stress applying film and a transistor in a P-type logic region PL is covered with a compressive stress applying film. Transistors in a P-type SRAM region PS and an N-type SRAM region NS are covered with an insulating film which applies lower stress than the stresses applied by the above-described two films.

15 Claims, 13 Drawing Sheets

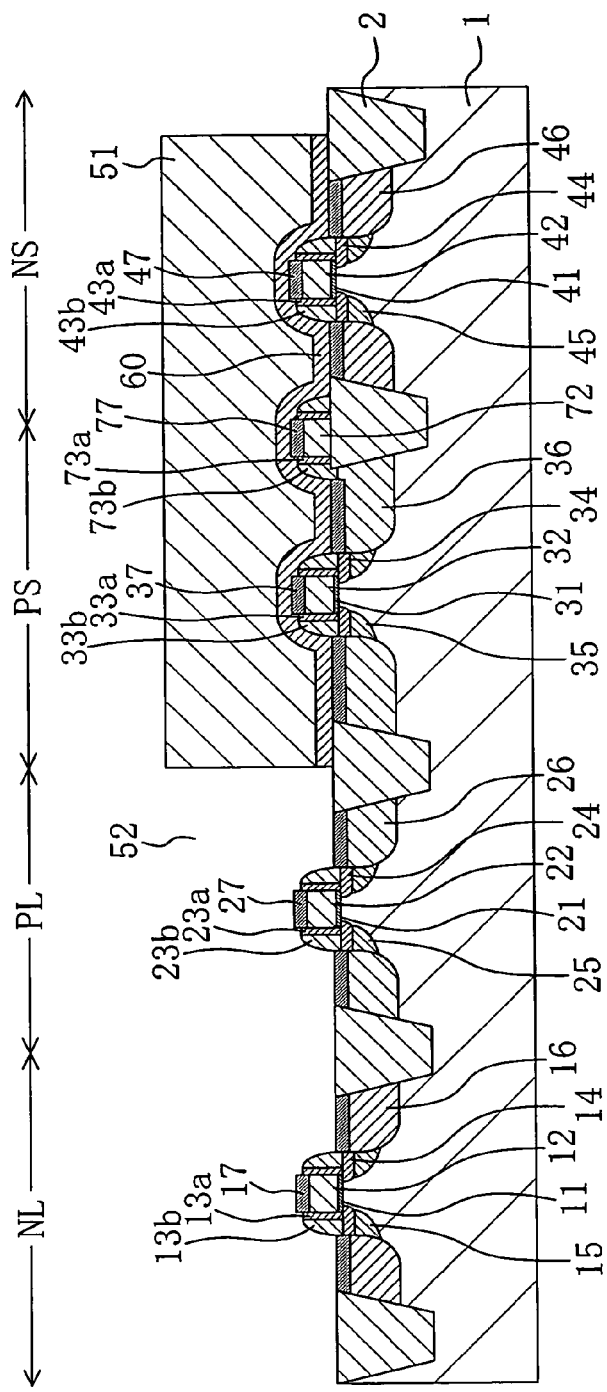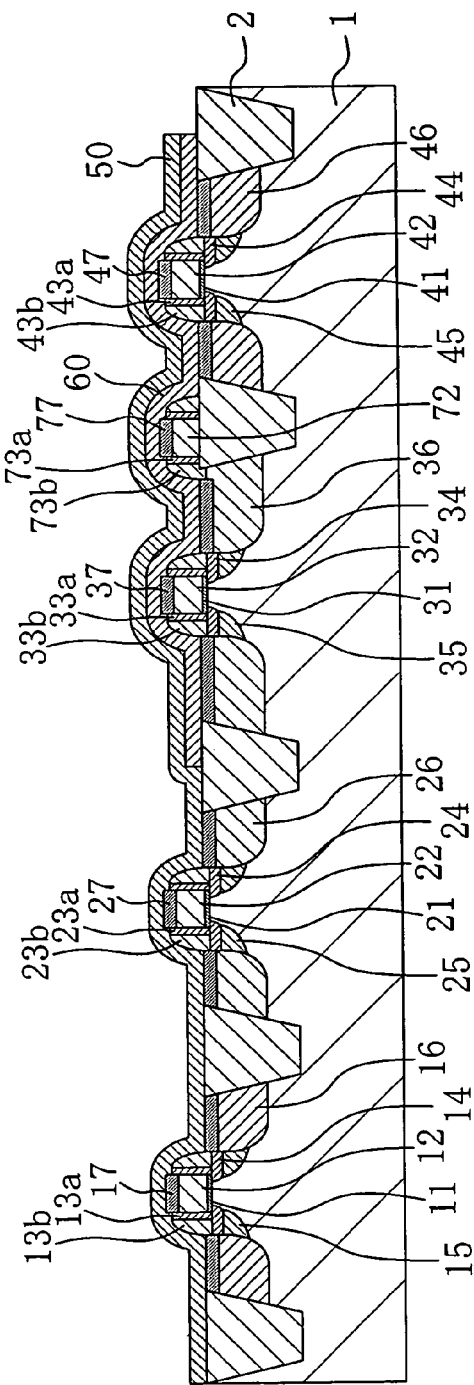
FIG. 3A
FIG. 3B

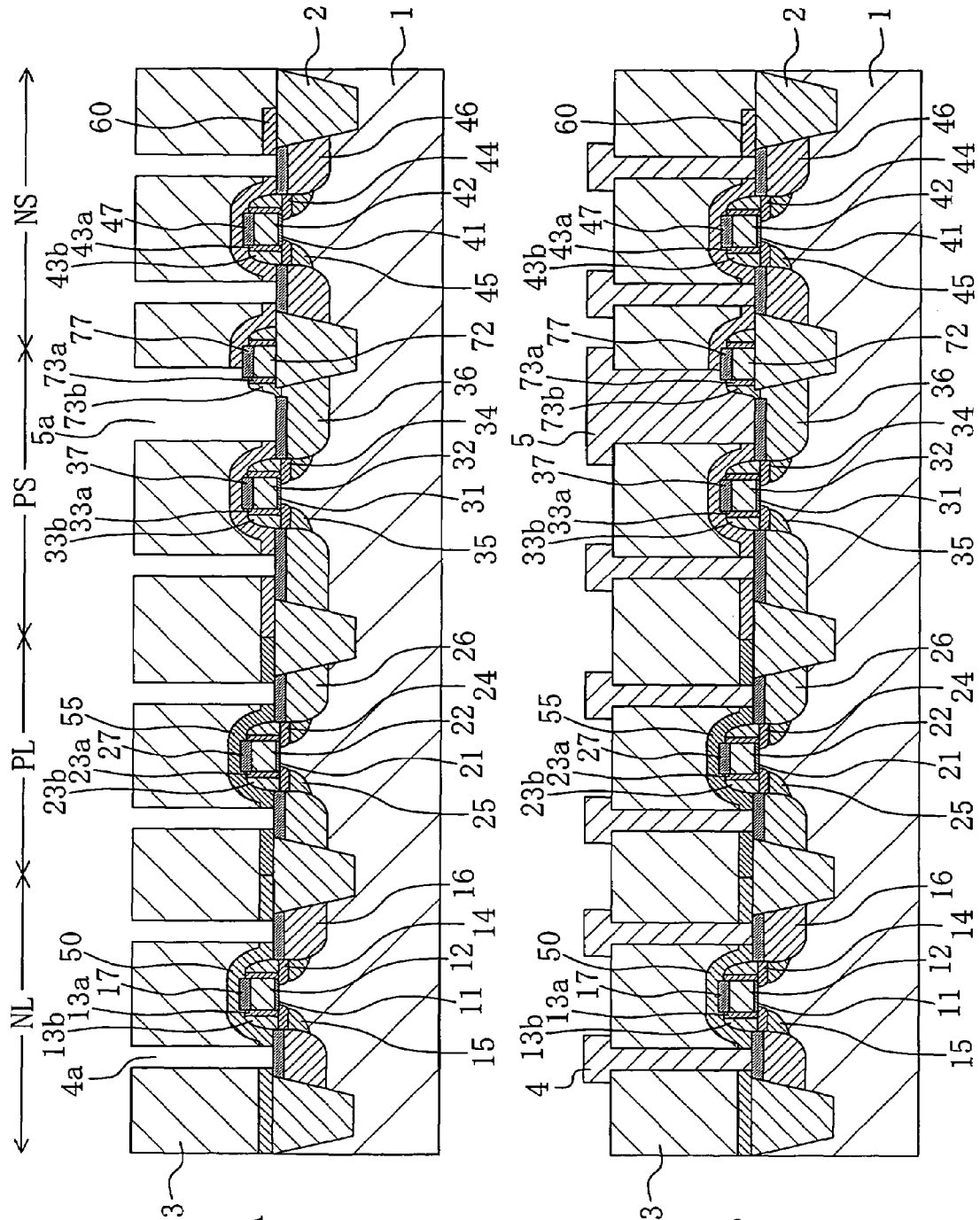

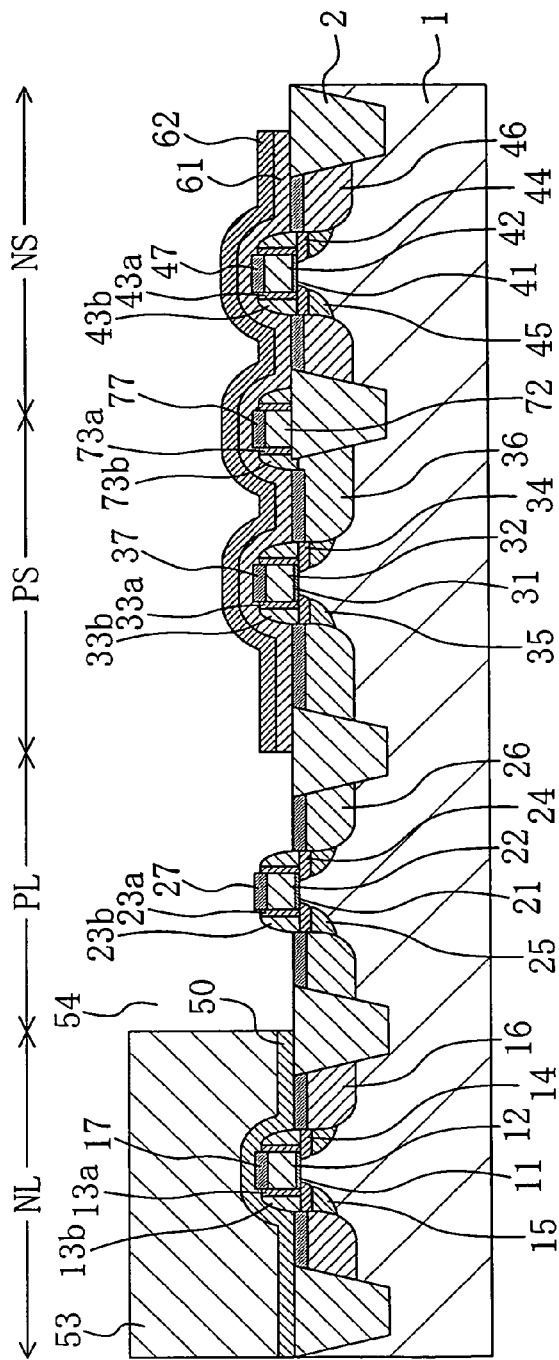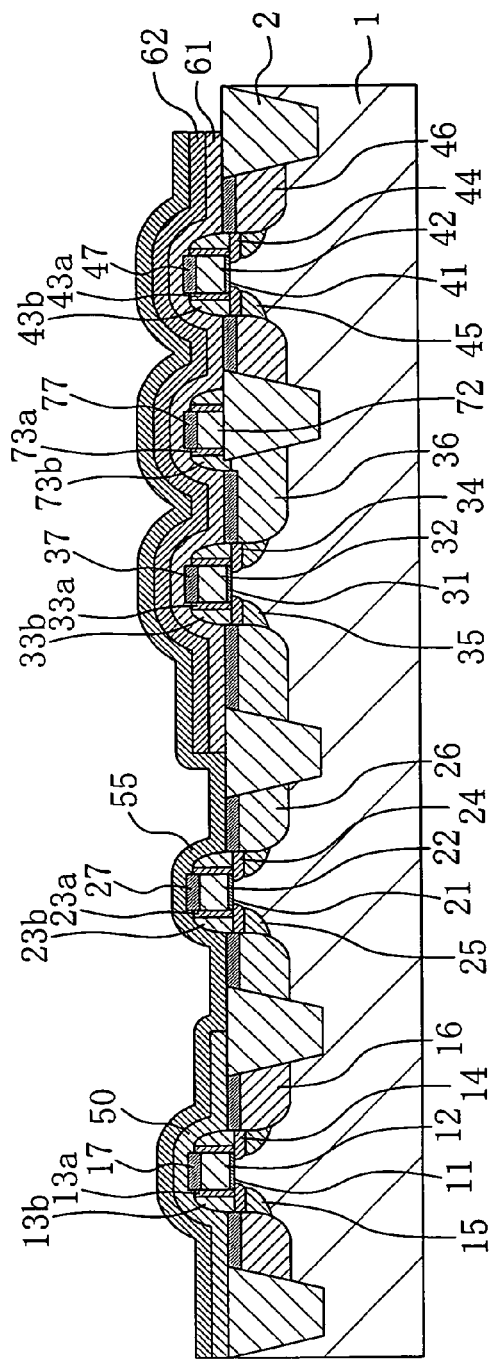

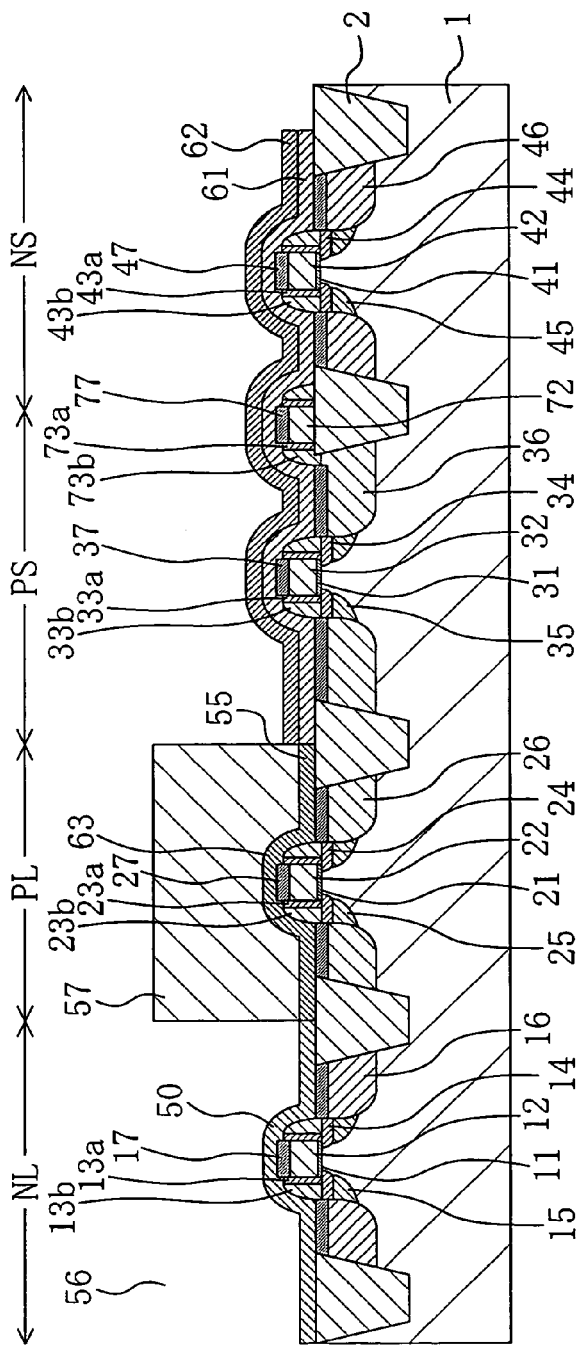
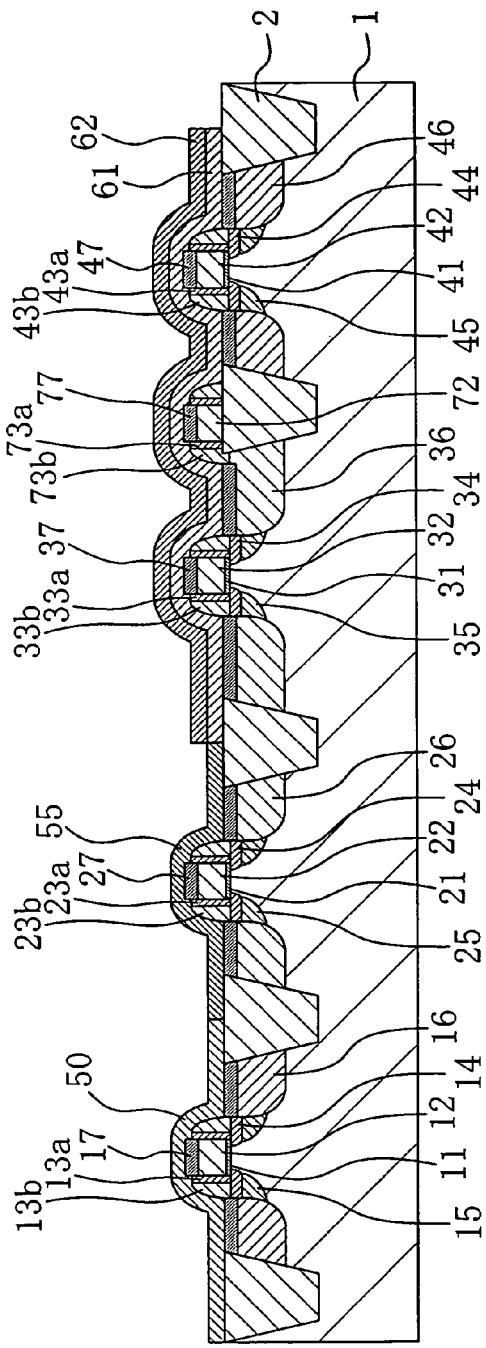
FIG. 11A
FIG. 11B

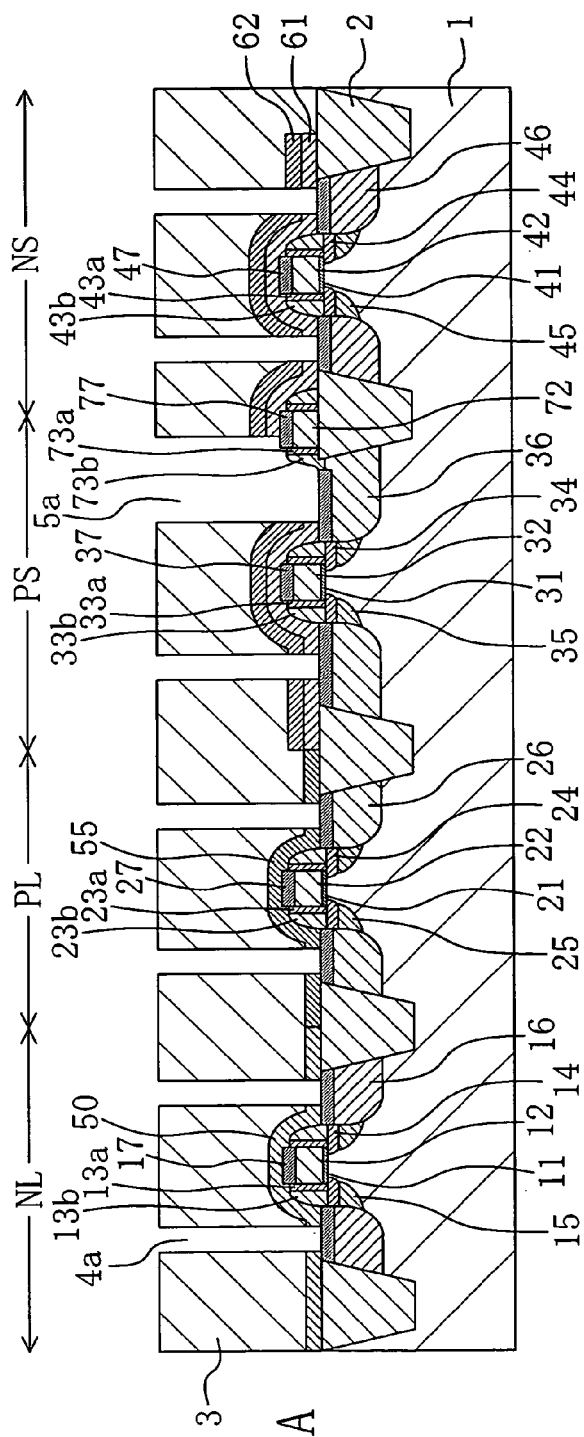
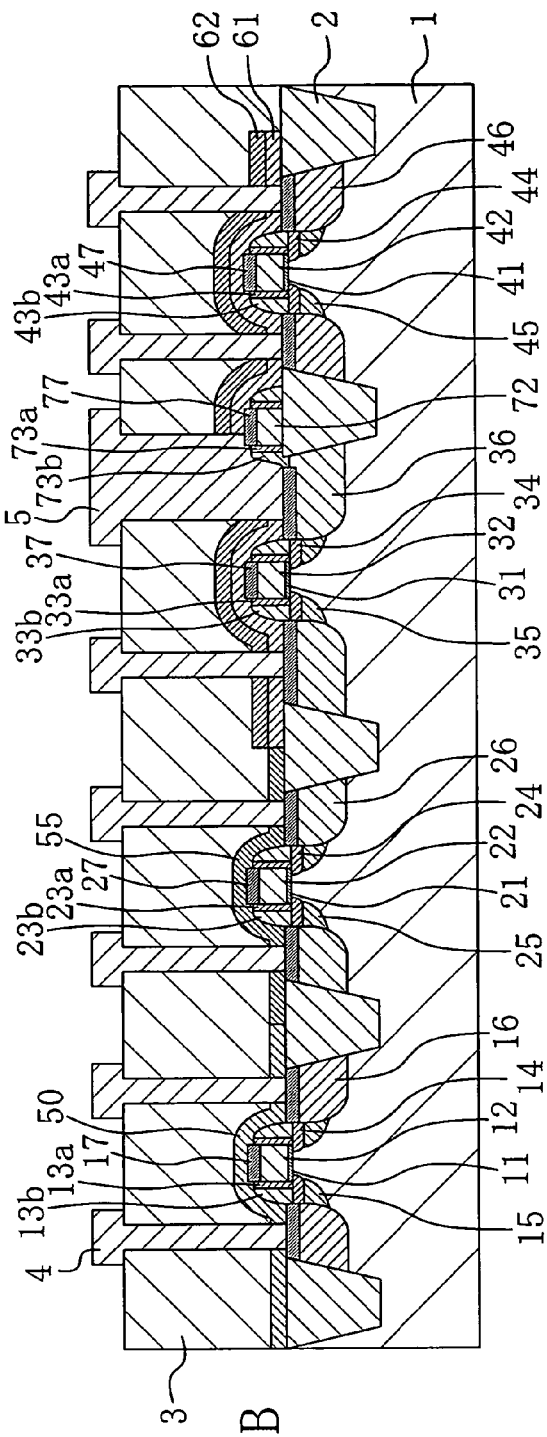
FIG. 12A
FIG. 12B

SEMICONDUCTOR DEVICE

BACKGROUND OF THE INVENTION

In the field of semiconductor devices, processing speed has been increasing and power consumption has been decreasing due to a rapid shift to finer design rules. Accordingly, the need for improvement in transistor performance becomes imperative. However, improvement in performance only by the fine design rules will soon hit a ceiling. In this respect, various novel techniques, such as a technique of applying stress to the transistors, have been developed for the improvement in performance.

For example, as shown in FIG. 13, Japanese Unexamined Patent Publication No. 2003-273240 proposes a method for improving the performance of the transistors by covering N-channel MIS transistors 101 with an LP-CVD (Low Pressure Chemical Vapor Deposition) film 103 which applies tensile stress and covering P-channel MIS transistors 102 with a plasma CVD film 104 which applies compressive stress.

However, the above-described method may cause the following problems.

In an SRAM region, the N-channel MIS transistors and the P-channel MIS transistors are densely arranged. Therefore, it is difficult to cover these transistors with different films applying stresses in different directions. If the N-channel and P-channel MIS transistors are covered with a stress applying film of a single kind, the performance of the N-channel MIS transistors and that of the P-channel MIS transistors may greatly vary. More specifically, the stress applying film improves the performance of one of the MIS transistors, but at the same time, it deteriorates the performance of the other MIS transistor.

It may be possible to cover the N-channel MIS transistors and the P-channel MIS transistors with different films applying stresses in different directions. However, when a stress applying insulating film is formed on the entire region and part of it located above any ones of the MIS transistors is removed, parts of sidewalls formed on the side surfaces of the gate electrode are etched away or part of a device isolation region is etched away. As a result, when a shared contact covering from one of the source/drain regions to a gate wiring is formed, junction leakage may increase between the source/drain region and the substrate or short circuit may occur between them.

SUMMARY OF THE INVENTION

In light of the above, an object of the present invention is to provide a semiconductor device in which the performances of the N-channel transistors and the P-channel transistors are kept in balance with use of a stress applying insulating film and a method for manufacturing the semiconductor device.

Another object of the present invention is to improve the performances of the N-channel MIS transistors and the P-channel MIS transistors in a logic region and keep the performances of the N-channel and P-channel MIS transistors in the SRAM region in balance while leakage current is prevented from occurring when a shared contact is formed.

A semiconductor device includes of the present invention includes: a first MIS transistor of a first conductivity type including a first gate electrode which is formed above a first active region made of a semiconductor layer and first source/drain regions which are formed in parts of the first active region located at the sides of the first gate electrode; a second MIS transistor of a second conductivity type including a second gate electrode which is formed above a second active region made of the semiconductor layer and second source/drain regions which are formed in parts of the second active region located at the sides of the second gate electrode; a third MIS transistor of a first conductivity type including a third gate electrode which is formed above a third active region made of the semiconductor layer and third source/drain regions which are formed in parts of the third active region located at the sides of the third gate electrode; a first insulating film which covers the first gate electrode, the first active region, the second gate electrode and the second active region and applies first stress; a second insulating film which covers the third gate electrode and the third active region and applies second stress; and an interlayer insulating film which is formed above the first insulating film and the second insulating film, wherein the absolute value of the first stress is smaller than the absolute value of the second stress.

In the semiconductor device of the present invention, the first stress is lower than the second stress. Therefore, stresses applied to the first MIS transistors and the second MIS transistors are reduced as compared with the prior art case where the first and second MIS transistors are covered with the second insulating film which applies the second stress. As a result, the stresses applied to the first MIS and second MIS transistors are alleviated in a balanced manner, whereby the performances of the first and second MIS transistors become almost equal. Therefore, even when the first and second MIS transistors are densely arranged so that they cannot easily be covered with different films, the performances of the first and second MIS transistors are kept in balance.

In the semiconductor device of the present invention, the first MIS transistor and the second MIS transistor may constitute an SRAM and the third MIS transistor may be formed in a logic region.

The semiconductor device of the present invention may further include: a third insulating film which lies between the first insulating film and the interlayer insulating film and applies third stress, wherein the absolute value of the third stress may be smaller than the absolute value of the second stress.

In the semiconductor device of the present invention, a gate wiring may be formed at the side of one of the first source/drain regions and first sidewalls may be formed on the side surfaces of the gate wiring, the first insulating film may cover the first source/drain regions, the first sidewalls and the gate wiring and a first shared contact may be formed to penetrate the interlayer insulating film and the first insulating film to reach the first source/drain regions, the first sidewalls and the gate wiring. In this case, a hole for forming the first shared contact is formed while the first sidewalls are covered with the first insulating film. Therefore, the first sidewalls are prevented from reduction by etching. Thus, the occurrence of leakage between the gate wiring and one of the first source/drain regions is prevented.

In the semiconductor device of the present invention, a gate wiring may be formed at the side of one of the second source/drain regions and second sidewalls may be formed on the side surfaces of the gate wiring, the first insulating film may cover the second source/drain regions, the second sidewalls and the gate wiring and a second shared contact may be formed to penetrate the interlayer insulating film and the first insulating film to reach the second source/drain regions, the second sidewalls and the gate wiring. In this case, a hole for forming the second shared contact is formed while the second sidewalls are covered with the first insulating film. Therefore, the second sidewalls are prevented from reduction by etching.

Thus, the occurrence of leakage between the gate wiring and one of the second source/drain regions is prevented.

In the semiconductor device of the present invention, the third MIS transistor may be an N-channel MIS transistor and the second stress may be tensile stress.

The semiconductor device of the present invention may further include: a fourth MIS transistor including a fourth gate electrode which is formed above a fourth active region made of the semiconductor layer and fourth source/drain regions formed in parts of the fourth active region located at the sides of the fourth gate electrode; and a fourth insulating film which covers the fourth gate electrode and the fourth active region and applies fourth stress, wherein the fourth stress may be applied in the direction opposite to the direction of the second stress and the absolute value of the first stress may be smaller than the absolute value of the fourth stress.

In the semiconductor device of the present invention, the fourth MIS transistor may be formed in a logic region.

In the semiconductor device of the present invention, the fourth MIS transistor may be a P-channel MIS transistor and the fourth stress may be compressive stress.

Further, the present invention provides a method for manufacturing a semiconductor device including: a first gate electrode which is formed above a first active region made of a semiconductor layer and first source/drain regions which are formed in parts of the first active region located at the sides of the first gate electrode; a second MIS transistor of a second conductivity type including a second gate electrode which is formed above a second active region made of the semiconductor layer and second source/drain regions which are formed in parts of the second active region located at the sides of the second gate electrode; and a third MIS transistor of a first conductivity type including a third gate electrode which is formed above a third active region made of the semiconductor layer and third source/drain regions which are formed in parts of the third active region located at the sides of the third gate electrode, the method comprising the steps of: (a) forming a first insulating film which covers the first gate electrode, the first active region, the second gate electrode and the second active region and applies first stress; (b) forming a second insulating film which covers the third gate electrode and the third active region and applies second stress after the step (a); (c) forming an interlayer insulating film above the first insulating film and the second insulating film, wherein the absolute value of the first stress is smaller than the absolute value of the second stress.

In the method of the present invention, the first stress is lower than the second stress. Therefore, stresses applied to the first MIS transistors and the second MIS transistors are reduced as compared with the prior art case where the first and second MIS transistors are covered with the second insulating film which applies the second stress. As a result, the stresses applied to the first MIS and second MIS transistors are alleviated in a balanced manner, whereby the performances of the first and second MIS transistors become almost equal. Therefore, even when the first and second MIS transistors are densely arranged so that they cannot easily be covered with different films, the performances of the first and second MIS transistors are kept in balance.

The method of the present invention may further include the step of forming a third insulating film which applies third stress on the first insulating film after the step (a) and before the step (b), wherein the absolute value of the third stress may be smaller than the absolute value of the second stress.

In the method of the present invention, the semiconductor device may further include a gate wiring which is formed at the side of the first active region and the method may further include the steps of: (d) forming first sidewalls on the side surfaces of the gate wiring before the step (a) and (e) forming a first shared contact which penetrates the interlayer insulating film and the first insulating film to reach the gate wiring, the first sidewalls and the first active region after the step (c). In this case, a hole for forming the first shared contact is formed while the first sidewalls are covered with the first insulating film. Therefore, the first sidewalls are prevented from reduction by etching. Thus, the occurrence of leakage between the gate wiring and one of the first source/drain regions is prevented.

In the method of the present invention, the semiconductor device may further include a gate wiring which is formed at the side of the second active region and the method may further include the steps of: (f) forming second sidewalls on the side surfaces of the gate wiring before the step (a) and (g) forming a second shared contact which penetrates the interlayer insulating film and the first insulating film to reach the gate wiring, the second sidewalls and the second active region after the step (c). In this case, a hole for forming the second shared contact is formed while the second sidewalls are covered with the first insulating film. Therefore, the second sidewalls are prevented from reduction by etching. Thus, the occurrence of leakage between the gate wiring and one of the second source/drain regions is prevented.

In the method of the present invention, the semiconductor device may further include a fourth MIS transistor of a second conductivity type which is formed above a fourth active region made of the semiconductor layer and fourth source/drain regions which are formed in parts of the fourth active region located at the sides of the fourth gate electrode, the method may further include the step of (d) forming a fourth insulating film which covers the fourth gate electrode and the fourth active region and applies fourth stress after the step (a) and before the step (c), the fourth stress may be applied in the direction opposite to the direction of the second stress and the absolute value of the first stress may be smaller than the absolute value of the fourth stress.

In the method of the present invention, the fourth MIS transistor may be a P-channel MIS transistor and the fourth stress may be compressive stress.

In the method of the present invention, the third MIS transistor may be an N-channel MIS transistor and the second stress may be tensile stress.

In the method of the present invention, the first MIS transistor and the second MIS transistor may constitute an SRAM.

In the method of the present invention, the third MIS transistor may be a P-channel MIS transistor and the second stress may be compressive stress.

BRIEF DESCRIPTION OF THE DRAWINGS

FIGS. 3A and 3B are sectional views illustrating the steps of manufacturing the semiconductor device of the first embodiment.

FIGS. 6A and 6B are sectional views illustrating the steps of manufacturing the semiconductor device of the first embodiment.

FIGS. 10A and 10B are sectional views illustrating the steps of manufacturing the semiconductor device of the second embodiment.

FIGS. 11A and 11B are sectional views illustrating the steps of manufacturing the semiconductor device of the second embodiment.

FIGS. 12A and 12B are sectional views illustrating the steps of manufacturing the semiconductor device of the second embodiment.

DETAILED DESCRIPTION OF THE INVENTION

Hereinafter, a semiconductor device and a method for manufacturing the same according to the present invention will be explained with reference to the drawings.

First Embodiment

Figure 1:
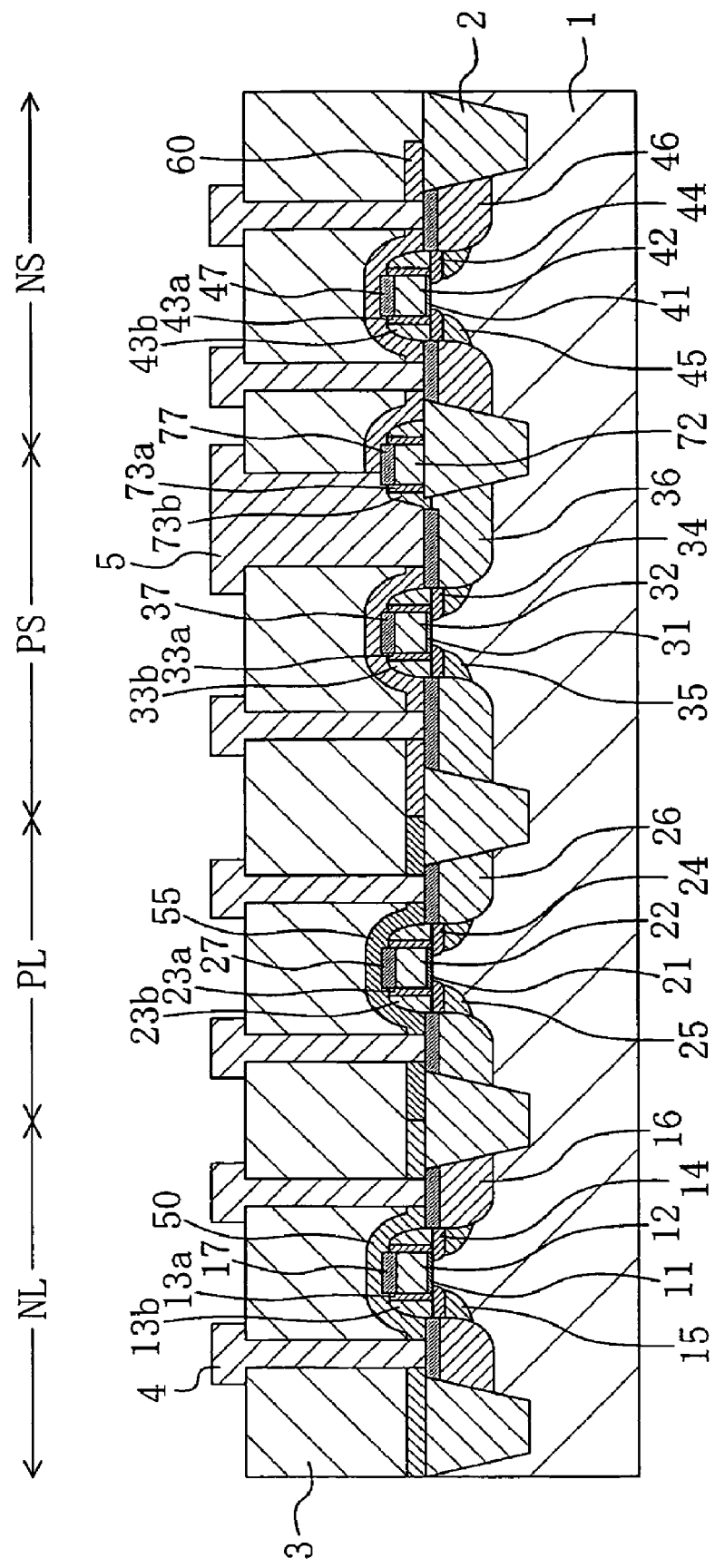
FIG. 1 is a sectional view illustrating the structure of a semiconductor device according to a first embodiment of the present invention.

FIG. 1 is a sectional view illustrating the structure of a semiconductor device according to the first embodiment of the present invention. As shown in FIG. 1, the semiconductor device of the present embodiment includes an N-type logic region NL for providing a logic MIS transistor of N-channel type, a P-type logic region PL for providing a logic MIS transistor of P-channel type, a P-type SRAM region PS for providing an SRAM MIS transistor of P-channel type and an N-type SRAM region NS for providing an SRAM MIS transistor of N-channel type. The regions NL, PL, PS and NS are electrically isolated from each other by a shallow trench isolation region 2.

In the N-type logic region NL, a gate electrode 12 is formed on a semiconductor substrate 1 with a gate insulating film 11 sandwiched therebetween. On the side surfaces of the gate electrode 12, offset sidewalls 13a are formed and sidewalls 13b are formed outside the offset sidewalls 13a. N-type extension regions 14 are formed in parts of the semiconductor substrate 1 below the offset sidewalls 13a and the sidewalls 13 and P-type pocket regions 15 are formed below the N-type extension regions 14. Further, N-type source/drain regions 16 are formed in parts of the semiconductor substrate 1 outside the sidewalls 13b. A silicide layer 17 is formed on the gate electrode 12 and the N-type source/drain regions 16.

In the N-type logic region NL, an insulating film 50 which is made of a silicon nitride film and applies tensile stress (hereinafter referred to as a tensile stress applying insulating film) is formed by LP-CVD to cover the gate electrode 12, offset sidewalls 13a, sidewalls 13b and N-type source/drain regions 16. The tensile stress mentioned in the present embodiment indicates stress applied along the gate length direction of a channel region below the gate electrode. Therefore, the tensile stress applying insulating film of the present embodiment indicates an insulating film which applies tensile stress along the gate length direction of a channel region below the gate electrode.

In the P-type logic region PL, a gate electrode 22 is formed on the semiconductor substrate 1 with a gate insulating film 21 sandwiched therebetween. On the side surfaces of the gate electrode 22, offset sidewalls 23a are formed and sidewalls 23b are formed outside the offset sidewalls 23a. P-type extension regions 24 are formed in parts of the semiconductor substrate 1 below the offset sidewalls 23a and the sidewalls 23b and N-type pocket regions 25 are formed below the P-type extension regions 24. Further, P-type source/drain regions 26 are formed in parts of the semiconductor substrate 1 outside the sidewalls 23b. A silicide layer 27 is formed on the gate electrode 22 and the P-type source/drain regions 26.

In the P-type logic region PL, an insulating film 55 which is made of a silicon nitride film and applies compressive stress (hereinafter referred to as a compressive stress applying insulating film) is formed by plasma CVD to cover the gate electrode 22, offset sidewalls 23a, sidewalls 23b and P-type source/drain regions 26. The compressive stress mentioned in the present embodiment indicates stress applied along the gate length direction of a channel region below the gate electrode. Therefore, the compressive stress applying insulating film of the present embodiment indicates an insulating film which applies compressive stress along the gate length direction of a channel region below the gate electrode.

In the P-type SRAM region PS, a gate electrode 32 is formed on the semiconductor substrate 1 with a gate insulating film 31 sandwiched therebetween. On the side surfaces of the gate electrode 32, offset sidewalls 33a are formed and sidewalls 33b are formed outside the offset sidewalls 33a. P-type extension regions 34 are formed in parts of the semiconductor substrate 1 below the offset sidewalls 33a and the sidewalls 33b and N-type pocket regions 35 are formed below the P-type extension regions 34. Further, P-type source/drain regions 36 are formed in parts of the semiconductor substrate 1 outside the sidewalls 33b. A silicide layer 37 is formed on the gate electrode 32 and the P-type source/drain regions 36.

In the P-type SRAM region PS, an insulating film 60 which is made of a silicon nitride film and applies low stress (hereinafter referred to as a low stress applying insulating film) is formed to cover the gate electrode 32, offset sidewalls 33a, sidewalls 33b and P-type source/drain regions 36. The low stress applying insulating film 60 functions as an etch stopper in etching an interlayer insulating film 3. The low stress applying insulating film 60 does not necessarily apply stress as long as it functions as an etch stopper in etching the interlayer insulating film 3. However, as the stress applied by an insulating film is not zero in general, it is described as "low stress applying". The low stress applying insulating film 60 may apply any one of tensile and compressive stresses. The low stress applying insulating film 60 applies tensile or compressive stress whose absolute value is lower than the absolute value of the tensile stress applied by the tensile stress applying insulating film 50 or the absolute value of compressive stress applied by the compressive stress applying insulating film 55. For example, the low stress applying insulating film 60 may be made of a low stress applying silicon nitride oxide film. It is preferable that the stress applied by the low stress applying insulating film 60 is not more than half of the stresses applied by the tensile stress applying insulating film 50 and the compressive stress applying insulating film 55. For example, when the stresses applied by the tensile stress applying insulating film 50 and the compressive stress applying insulating film 55 are 1.6 GPa, respectively, the low stress applying insulating film 60 preferably applies a stress not more than half of it, i.e., 0.8 GPa or less.

On the shallow trench isolation region 2 located at the side of one of the P-type source/drain region 36, a gate wiring 72 is formed. A silicide layer 77 is formed on the top surface of the gate wiring 72, offset sidewalls 73a are formed on the side surfaces of the gate wiring 72 and sidewalls 73b are formed on the side surfaces of the offset sidewalls 73a. The gate wiring 72 is made of part of the film for forming the gate electrodes of adjacent transistors (not shown) in the SRAM region extending on the shallow trench isolation region 2.

In the N-type SRAM region NS, a gate electrode 42 is formed on the semiconductor substrate 1 with a gate insulating film 41 sandwiched therebetween. On the side surfaces of the gate electrode 42, offset sidewalls 43a are formed and sidewalls 43b are formed outside the offset sidewalls 43a. N-type extension regions 44 are formed in parts of the semiconductor substrate 1 below the offset sidewalls 43a and the sidewalls 43b and P-type pocket regions 45 are formed below the N-type extension regions 44. Further, N-type source/drain regions 46 are formed in parts of the semiconductor substrate 1 outside the sidewalls 43b. A silicide layer 47 is formed on the gate electrode 42 and the N-type source/drain regions 46.

In the N-type SRAM region NS, a low stress applying insulating film 60 which is made of a silicon nitride film is formed to cover the gate electrode 42, offset sidewalls 43a, sidewalls 43b and N-type source/drain regions 46. The stress applied by the low stress applying insulating film 60 is lower than the stresses applied by the tensile stress applying insulating film 50 and the compressive stress applying insulating film 55 formed in the logic regions NL and PL. The low stress applying insulating film 60 preferably applies a stress not more than half of the stresses applied by the tensile stress applying insulating film 50 and the compressive stress applying insulating film 55.

In the regions NL, PL, PS and NS, an interlayer insulating film 3 is formed to cover the tensile stress applying insulating film 50, compressive stress applying insulating film 55 and low stress applying insulating film 60. Further, in the regions NL, PL, PS and NS, contact electrodes 4 are formed to penetrate the tensile stress applying insulating film 50, compressive stress applying insulating film 55, low stress applying insulating film 60 and interlayer insulating film 3 to reach the silicide layers 17, 27, 37 and 47. Further, in the P-type SRAM region PS, a shared contact electrode 5 is formed to penetrate the interlayer insulating film 3 to contact the silicide layer on one of the P-type source/drain regions 36 and the silicide layer on the gate wiring 72.

Now, a method for manufacturing the semiconductor device of the present embodiment will be explained with reference to FIGS. 2A to 6B. FIGS. 2A to 6B are sectional views illustrating the steps of manufacturing the semiconductor device of the first embodiment.

Figure 2A:
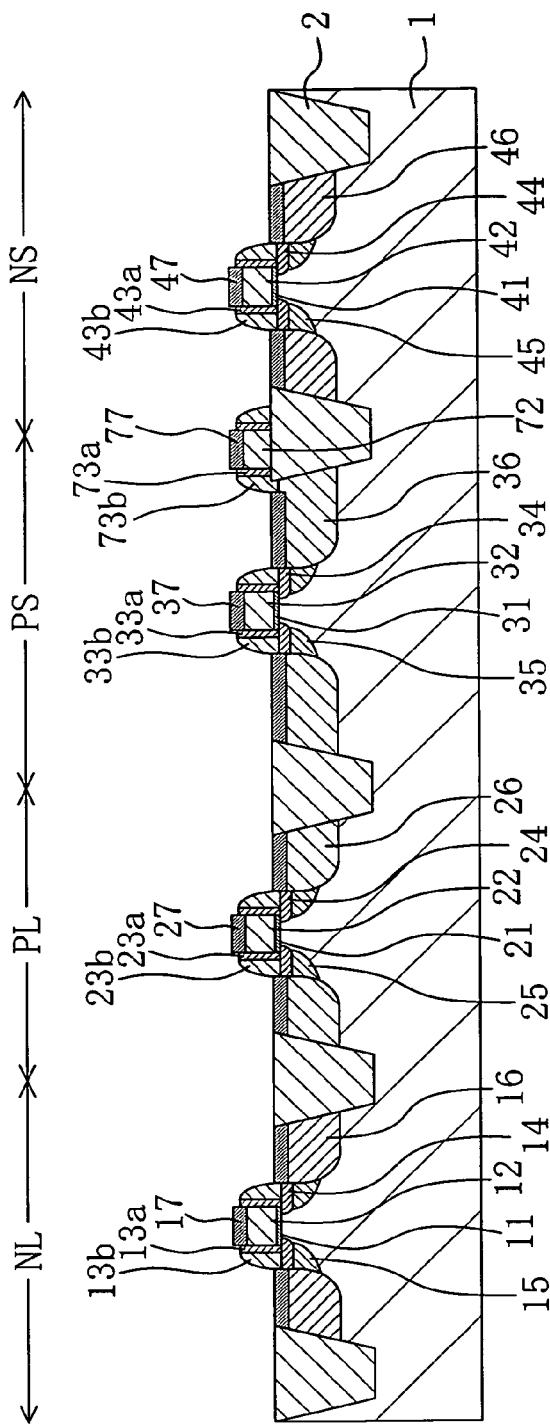
FIGS. 2A and 2B are sectional views illustrating the steps of manufacturing the semiconductor device of the first embodiment.

In the method of the present invention, first, in the step shown in FIG. 2A, gate insulating films 11, 21, 31 and 41 and gate electrodes 12, 22, 32 and 42 are formed on active regions made of a semiconductor substrate 1 in an N-type logic region NL, a P-type logic region PL, a P-type SRAM region PS and an N-type SRAM region NS which are isolated from each other by a shallow trench isolation region 2 formed in the semiconductor substrate 1. At the same time, a gate wiring 72 is formed on the shallow trench isolation region 2. Then, offset sidewalls 13a, 23a, 33a, 43a and 73a are formed on the side surfaces of the gate electrodes 12, 22, 32 and 42 and the gate wiring 72.

Subsequently, in the N-type logic region NL and the N-type SRAM region NS, N-type impurities such as arsenic ions are implanted at acceleration energy of 3 KeV, a dose of $1.5 \times 10^{15}$ ion/cm$^2$ and a tilt angle of 0° to form N-type extension regions 14 and 44. Then, P-type impurities such as boron ions are implanted at acceleration energy of 10 KeV, a dose of $8.0 \times 10^{12}$ ion/cm$^2$ and a tilt angle of 25° from four directions by rotating the wafer to form P-type pocket regions 15 and 45. The P-type pocket regions 15 and 45 are formed to cover the bottom surfaces of the N-type extension regions 14 and 44, respectively.

Then, in the P-type logic region PL and the P-type SRAM region PS, P-type impurities such as boron ions are implanted at acceleration energy of 0.5 KeV, a dose of $3.0 \times 10^{14}$ ion/cm$^2$ and a tilt angle of 0° to form P-type extension regions 24 and 34. Then, N-type impurities such as phosphorus ions are implanted at acceleration energy of 30 KeV, a dose of $7.0 \times 10^{12}$ ion/cm$^2$ and a tilt angle of 25° from four directions by rotating the wafer to form N-type pocket regions 25 and 35. The N-type pocket regions 25 and 35 are formed to cover the bottom surfaces of the P-type extension regions 24 and 34, respectively.

Then, a silicon nitride film is formed over the entire surface of the substrate by LP-CVD. The silicon nitride film is then etched back to form sidewalls 13b, 23b, 33b, 43b and 73b covering the side surfaces of the gate electrodes 12, 22, 32 and 42 and the gate wiring 72. After that, in the N-type logic region NL and the N-type SRAM region NS, N-type impurities such as arsenic ions are implanted at acceleration energy of 20 KeV, a dose of $4.0 \times 10^{15}$ ion/cm$^2$ and a tilt angle of 0° and N-type impurities such as phosphorus ions are implanted at acceleration energy of 10 KeV, a dose of $1.0 \times 10^{15}$ ion/cm$^2$ and a tilt angle of 7°. Thus, N-type source/drain regions 16 and 46 are formed.

Subsequently, in the P-type logic region PL and the P-type SRAM region PS, P-type impurities such as boron ions are implanted at acceleration energy of 2 KeV, a dose of $4.0 \times 10^{15}$ ion/cm$^2$ and a tilt angle of 7° to form P-type source/drain regions 26 and 36.

Then, by a salicide technique, silicide layers 17, 27, 37 and 47 are formed selectively on the gate electrodes 12, 22, 32 and 42 and the source/drain regions 16, 26, 36 and 46 and a silicide layer 77 is formed on the gate wiring 72.

Figure 2B:
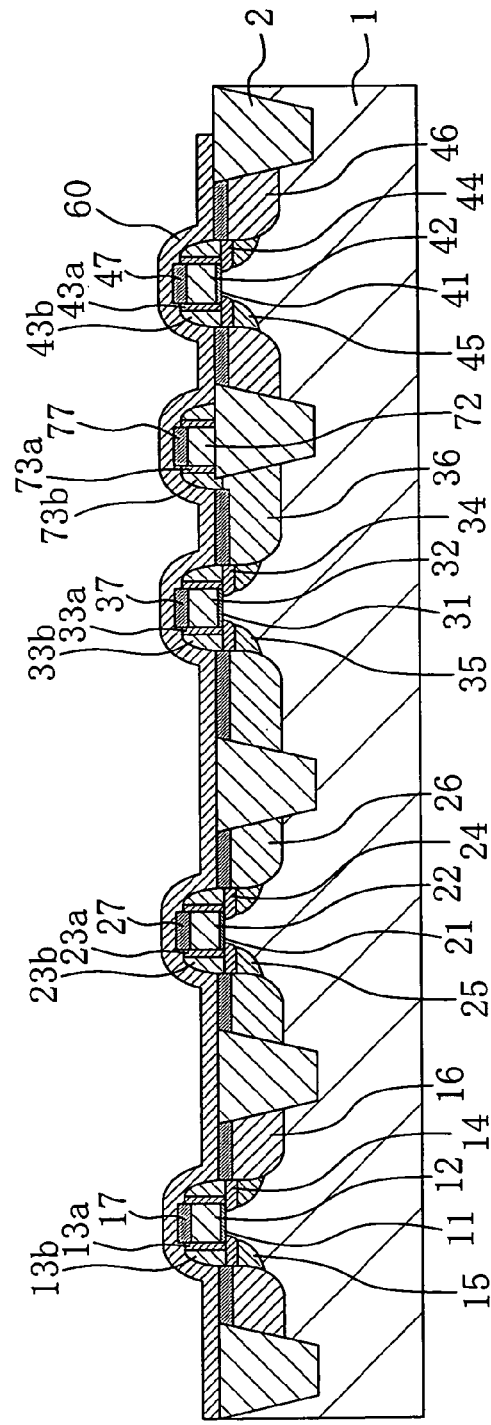

In the step shown in FIG. 2B, a silicon nitride film is formed over the entire surface of the substrate by LP-CVD as a low stress applying insulating film 60 of 30 nm thick.

In the step shown in FIG. 3A, a first resist mask 51 having an opening 52 is formed on the substrate such that the N-type SRAM region NS and the P-type SRAM region PS are covered and the N-type logic region NL and the P-type logic region PL are exposed. Using the first mask 51 as an etch mask, the low stress applying insulating film 60 is removed by etching from the P-type logic region PL and the N-type logic region NL.

In the step shown in FIG. 3B, the first mask 51 is removed and a silicon nitride film is formed over the entire surface of the substrate by LP-CVD as a tensile stress applying insulating film 50.

Figure 4A:
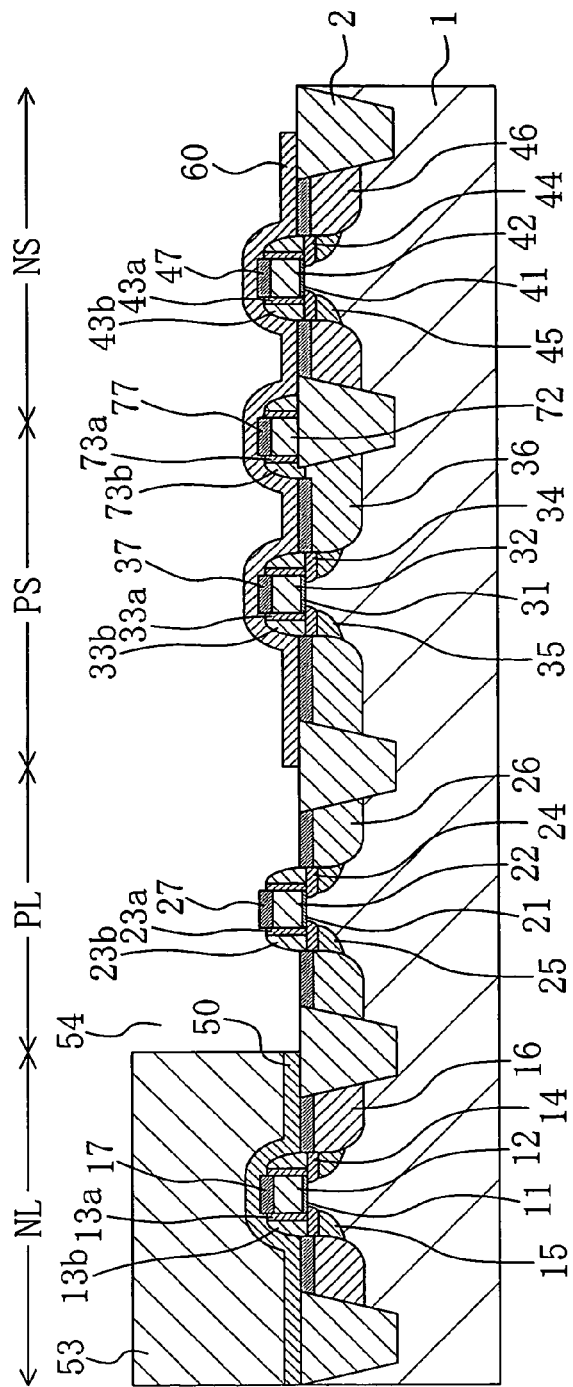
FIGS. 4A and 4B are sectional views illustrating the steps of manufacturing the semiconductor device of the first embodiment.

In the step shown in FIG. 4A, a second resist mask 53 having an opening 54 is formed on the substrate such that the N-type logic region NL is covered and the P-type logic region PL, N-type SRAM region NS and P-type SRAM region PS are exposed. Using the second mask 53 as an etch mask, the tensile stress applying insulating film 50 is removed by etching from the P-type logic region PL, N-type SRAM region NS and P-type SRAM region PS. The tensile stress applying insulating film 50 is left only in the N-type logic region NL.

Figure 4B:
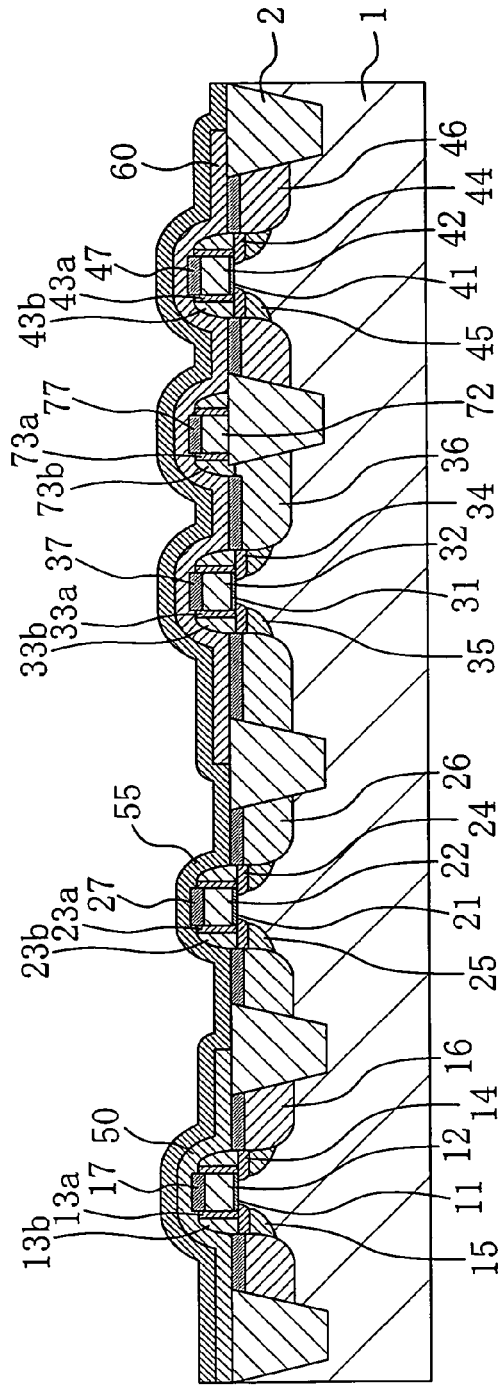

In the step shown in FIG. 4B, the second mask 53 is removed and a silicon nitride film is formed over the entire surface of the substrate by plasma CVD as a compressive stress applying insulating film 55.

Figure 5A:
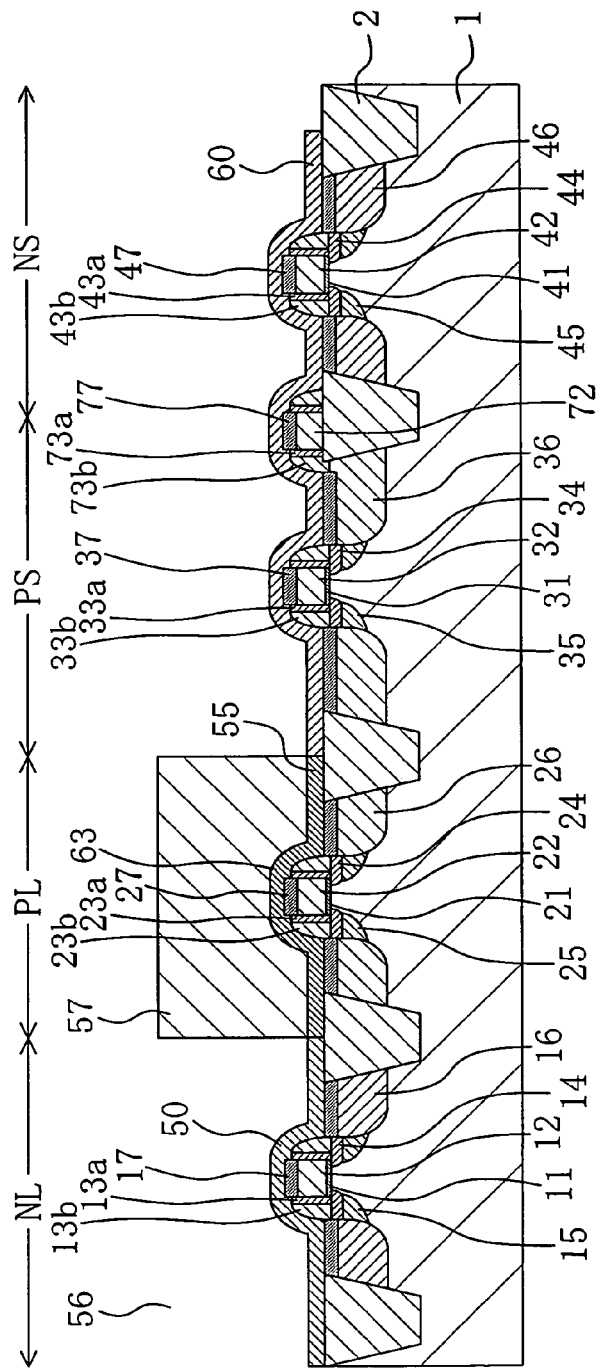
FIGS. 5A and 5B are sectional views illustrating the steps of manufacturing the semiconductor device of the first embodiment.

In the step shown in FIG. 5A, a third resist mask 57 having an opening 56 is formed on the substrate such that the P-type logic region PL is covered and the N-type logic region NL, P-type SRAM region PS and N-type SRAM region NS are exposed. Using the third mask 57 as an etch mask, the compressive stress applying insulating film 55 is removed by etching from the N-type logic region NL, P-type SRAM region PS and N-type SRAM region NS. The compressive stress applying insulating film 55 is left only in the P-type logic region PL.

Figure 5B:
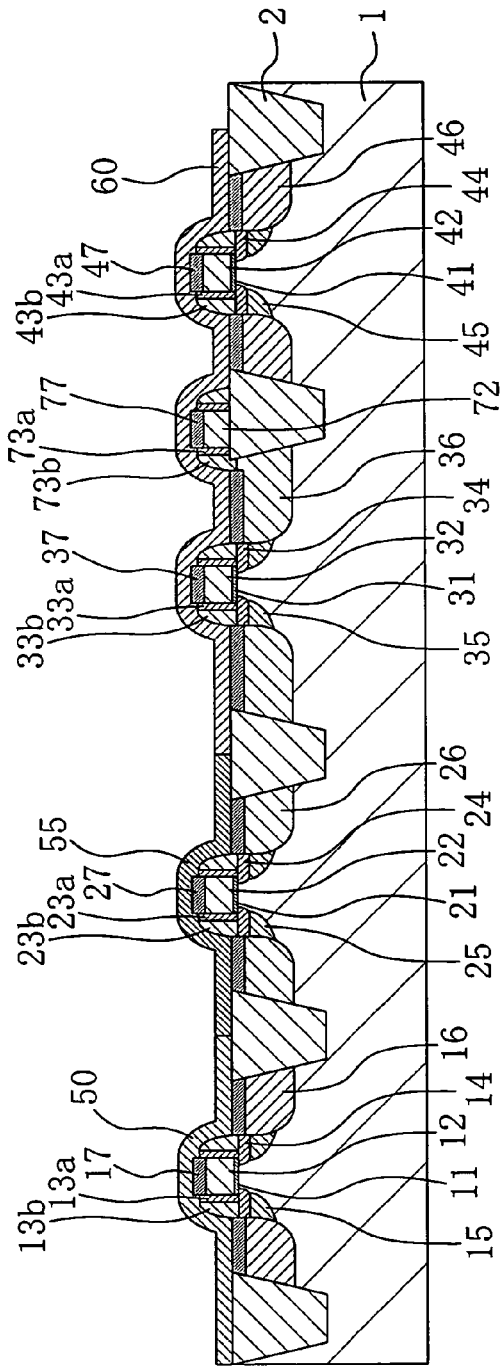

In the step shown in FIG. 5B, the third mask 57 is removed.

In the step shown in FIG. 6A, an interlayer insulating film 3 made of an oxide film is formed over the entire surface of the substrate. Then, the interlayer insulating film 3, tensile stress applying insulating film 50, compressive stress applying insulating film 55 and low stress applying insulating film 60 are subjected to lithography and etching to form contact holes 4a and a shared contact hole 5a reaching the silicide layers 17, 27, 37 and 47.

In the step shown in FIG. 6B, buried contact electrodes 4 and a shared contact electrode 5 are formed in the contact holes 4a and the shared contact hole 5a. The buried contact electrodes 4 and the shared contact electrode 5 are made of a combination of a barrier film made of TiN and a metal film made of tungsten, for example. Through the above-described steps, the semiconductor device of the present embodiment is fabricated.

In the semiconductor device of the present embodiment, the gate electrode 12 and the N-type source/drain regions (active regions) 16 in the N-type logic region NL are covered with the tensile stress applying insulating film 50. This structure improves the performance (drive capability) of the N-channel logic MIS transistors in the N-type logic region NL. In the P-type logic region PL, the gate electrode 22 and the P-type source/drain regions (active regions) 26 are covered with the compressive stress applying insulating film 55. This structure improves the performance (drive capability) of the P-channel logic MIS transistors in the P-type logic region PL.

Further, the gate electrode 32 and the P-type source/drain regions (active regions) 36 in the P-type SRAM region PS and the gate electrode 42 and the N-type source/drain regions (active regions) 46 in the N-type SRAM region NS are covered with the low stress applying insulating film 60. In this case, stress applied to the active regions in the P-type and N-type SRAM regions PS and NS is lower than the stress applied by the tensile or compressive stress applying insulating film to the active regions in the logic regions PL and NL. As a result, the performance of N-channel SRAM MIS transistors in the N-type SRAM region NS and that of P-channel SRAM MIS transistors in the P-type SRAM region PS become almost equal. Thus, if the N-type MIS transistors and the P-type MIS transistors in the SRAM regions are arranged close to each other and it is difficult to cover the transistors with different films, the MIS transistors in both of the SRAM regions are kept in balance.

According to the method for manufacturing the semiconductor device of the present embodiment, in the step of etching the interlayer insulating film 3 made of an oxide film to form the contact holes 4a and the shared contact hole 5a as shown in FIG. 6A, the tensile stress applying insulating film 50, compressive stress applying insulating film 55 and low stress applying insulating film 60, which are made of nitride films, function as etch stoppers. As a result, the offset sidewalls 73a and the sidewalls 73b are prevented from being reduced during the etching of the interlayer insulating film 3. Further, in the formation of the contact holes 4a and the shared contact hole 5a, the etch amount of the tensile stress applying insulating film 50, compressive stress applying insulating film 55 and low stress applying insulating film 60 is small. Therefore, the amount of the offset sidewalls 73a and the sidewalls 73b etched at the same time is reduced. Thus, as compared with the prior art method in which the low stress applying insulating film 60 is not formed, the sidewalls 73a and 73b are prevented from being reduced by etching and the occurrence of junction leakage at the P-type source/drain regions 36 is prevented.

In the present embodiment, the explanation is provided for the formation of the SRAM region. In general, the MIS transistors for the SRAM are required to show uniform performance, the present invention is effectively applied thereto. However, the present invention is not limited to the SRAM. Specifically, if the above-described low stress applying insulating film is formed over the P-type and N-type MIS transistors which are formed on a single substrate, the performances of the transistors are kept in balance. In particular when the P-type MIS transistors and the N-type MIS transistors are arranged close to each other, it is difficult to cover the transistors with different films. Therefore, the method of the present invention is effectively applied thereto.

Second Embodiment

Figure 7:
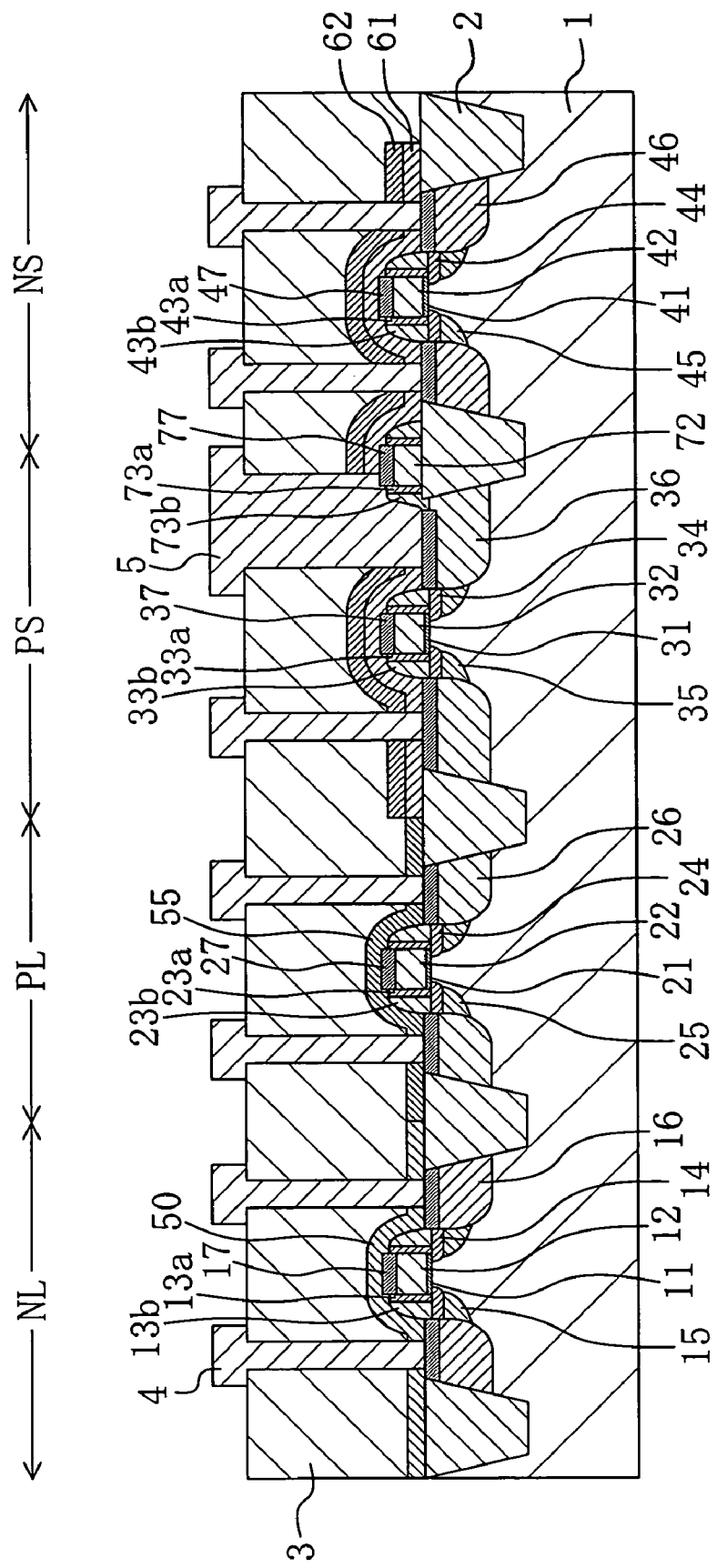
FIG. 7 is a sectional view illustrating the structure of a semiconductor device according to a second embodiment of the present invention.

FIG. 7 is a sectional view illustrating the structure of a semiconductor device of the second embodiment of the present invention. As shown in FIG. 7, in the semiconductor device of the present embodiment, a layered film including a first low stress applying insulating film 61 made of a silicon nitride film and a second low stress applying insulating film 62 made of a silicon oxide film is formed in the N-type SRAM region NS and the P-type SRAM region PS. The first low stress applying insulating film 61 of the present embodiment does not necessarily apply stress as long as it functions as an etch stopper in etching the interlayer insulating film 3. However, as the stress applied by an insulating film is not zero in general, it is described as "low stress applying". The first low stress applying insulating film 61 applies tensile or compressive stress whose absolute value is lower than the absolute value of the tensile or compressive stress applied by the tensile stress applying insulating film 50 or the compressive stress applying insulating film 55. The second low stress applying insulating film 62 of the present embodiment does not necessarily apply stress as long as it functions as an etch stopper in etching the tensile stress applying insulating film 50 and the compressive stress applying insulating film 55. However, as the stress applied by an insulating film is not zero in general, it is described as "low stress applying". The insulating film 62 applies tensile or compressive stress whose absolute value is lower than the absolute value of the tensile or compressive stress applied by the tensile stress applying insulating film 50 or the compressive stress applying insulating film 55. However, it is preferable that the first low stress applying insulating film 61 applies stress in the direction opposite to the direction of the stress applied by the second low stress applying insulating film 62. For example, if the first low stress applying insulating film 61 applies tensile stress, the second low stress applying insulating film 62 applies compressive stress such that the stresses cancel each other to reduce the stresses to a further degree. The stress applied by the first low stress applying insulating film 61 is lower than the stresses applied by the tensile stress applying insulating film 50 and the compressive stress applying insulating film 55 formed in the logic regions NL and PL. Further, the stress applied by the first low stress applying insulating film 61 is preferably not more than half of the stresses applied by the tensile stress applying insulating film 50 and the compressive stress applying insulating film 55. The stress applied by the second low stress applying insulating film 62 is lower than the stresses applied by the tensile stress applying insulating film 50 and the compressive stress applying insulating film 55 formed in the logic regions NL and PL. The stress applied by the second low stress applying insulating film 62 is preferably not more than half of the stresses applied by the tensile stress applying insulating film 50 and the compressive stress applying insulating film 55.

FIGS. 8A to 12B are sectional views illustrating the steps of manufacturing the semiconductor device of the second embodiment. According to the method of the present embodiment, in the step shown in FIG. 8A, gate electrodes 12, 22, 32 and 42 and a gate wiring 72 are formed in the same manner as described in the first embodiment. Then, a silicon nitride film is formed over the entire surface of the substrate as a first low stress applying insulating film 61.

Figure 8A:
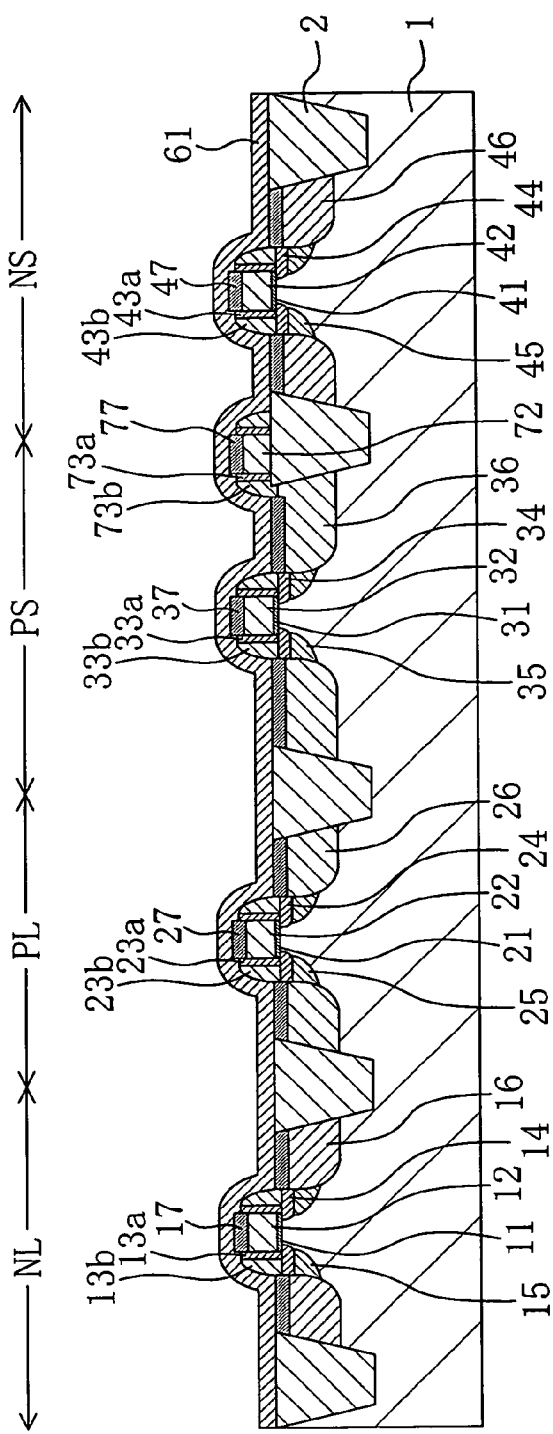
FIGS. 8A and 8B are sectional views illustrating the steps of manufacturing the semiconductor device of the second embodiment.
Figure 8B:
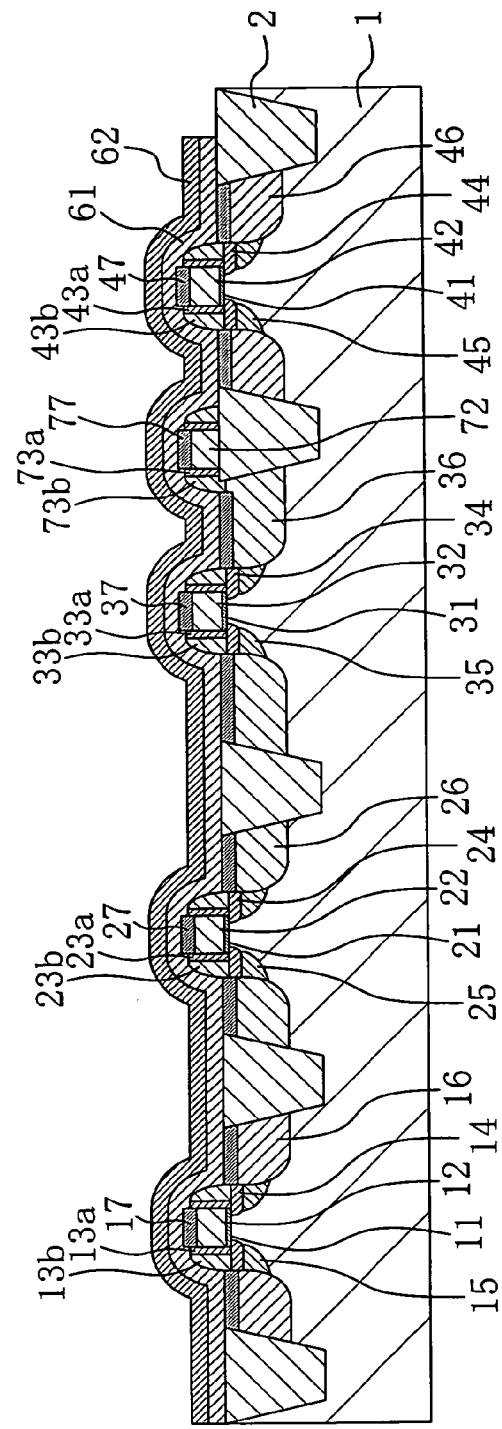

In the step shown in FIG. 8B, a silicon oxide film is formed over the entire surface of the substrate to provide a second low stress applying insulating film 62.

Figure 9A:
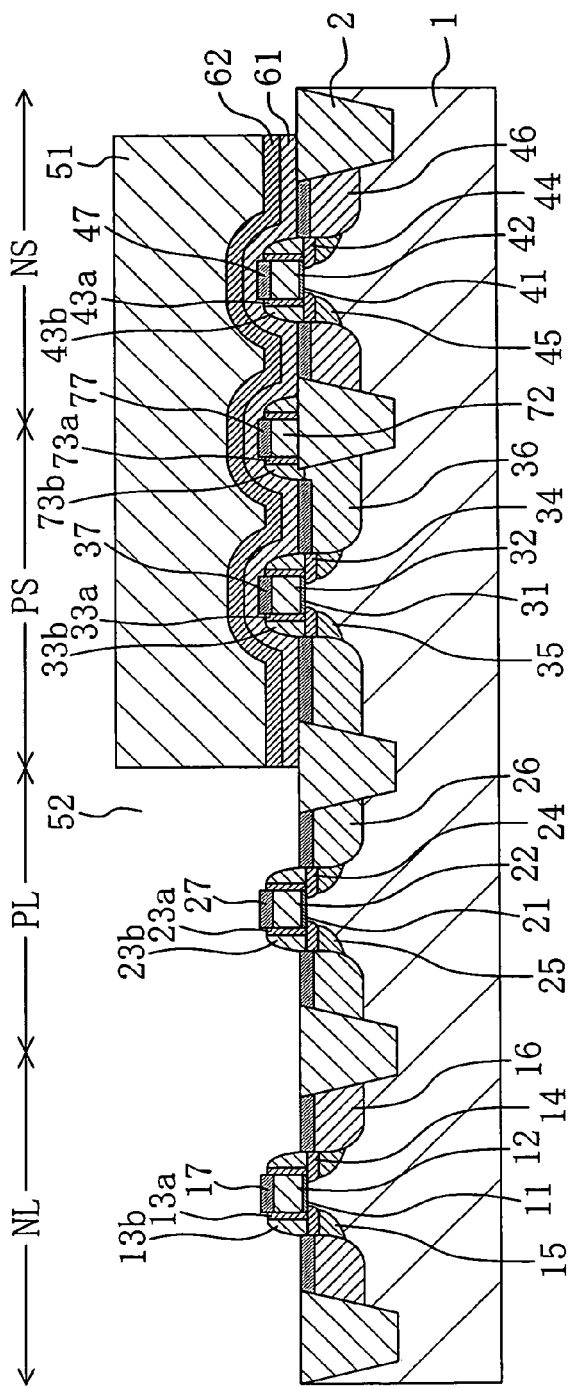
FIGS. 9A and 9B are sectional views illustrating the steps of manufacturing the semiconductor device of the second embodiment.

In the step shown in FIG. 9A, a first resist mask 51 having an opening 52 is formed on the substrate to cover the P-type SRAM region PS and the N-type SRAM region NS and expose the P-type logic region PL and the N-type logic region NL. Using the first mask 51 as an etch mask, the first and second low stress applying insulating films 61 and 62 are removed by etching from the P-type logic region PL and the N-type logic region NL.

Figure 9B:
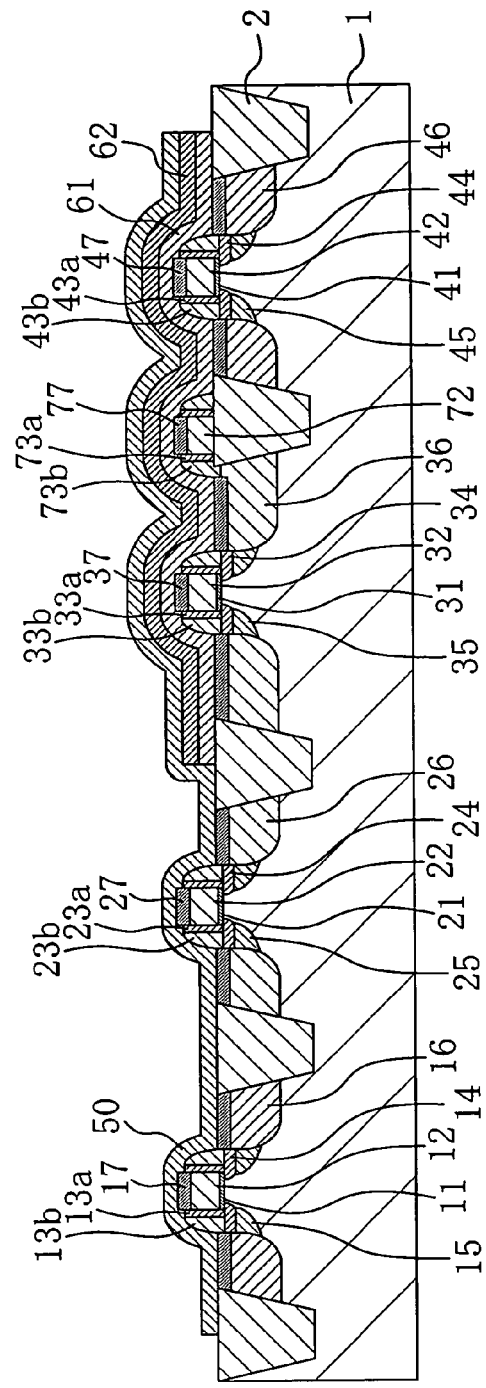
Figure 13:
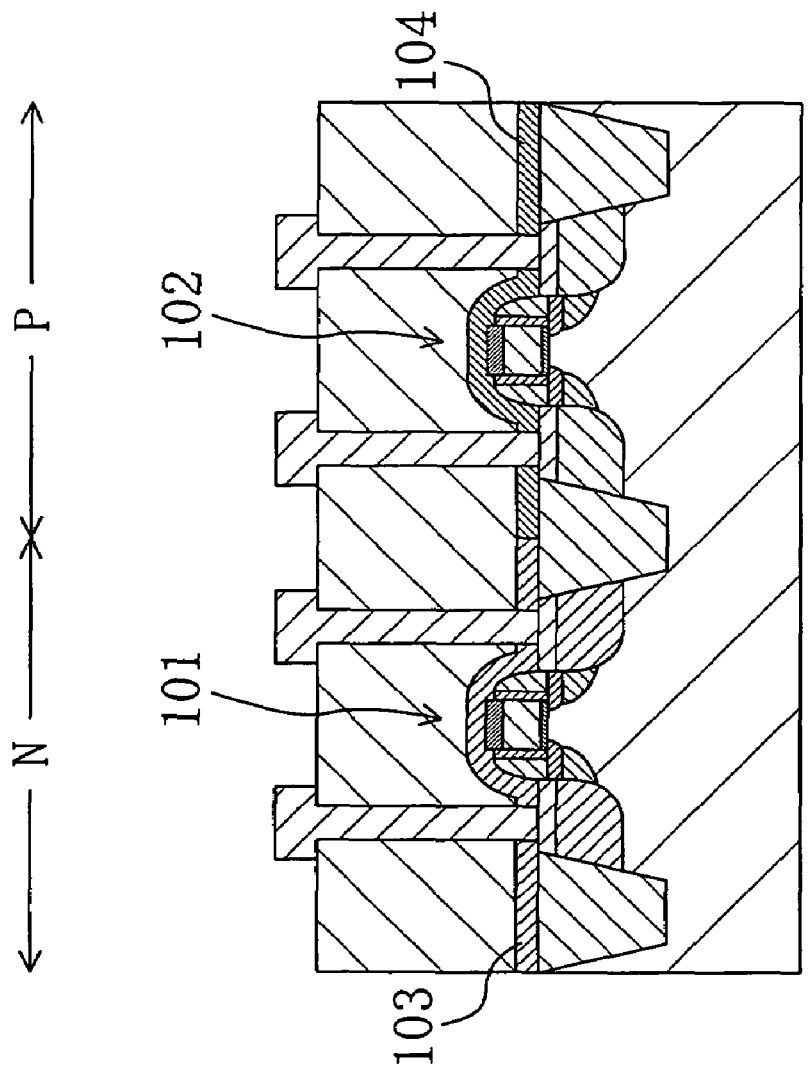
FIG. 13 is a sectional view illustrating the structure of a conventional transistor.

In the step shown in FIG. 9B, the first mask 51 is removed and a silicon nitride film is formed on the entire surface of the substrate by LP-CVD as a tensile stress applying insulating film 50.

In the step shown in FIG. 10A, a second resist mask 53 having an opening 54 is formed on the substrate to cover the N-type logic region NL and expose the P-type logic region PL, P-type SRAM region PS and N-type SRAM region NS. Using the second mask 53 as an etch mask, the tensile stress applying insulating film 60 is removed by etching from the P-type logic region PL, P-type SRAM region PS and N-type SRAM region NS. At this time, the second low stress applying insulating film 62 functions as an etch stopper in the P-type and N-type SRAM regions PS and NS so that the first low stress applying insulating film 61 remains unetched.

In the step shown in FIG. 10B, the second mask 53 is removed and a silicon nitride film is formed on the entire surface of the substrate by plasma CVD as a compressive stress applying insulating film 55.

In the step shown in FIG. 11A, a third resist mask 57 having an opening 56 is formed on the substrate to cover the P-type logic region PL and expose the N-type logic region NL, P-type SRAM region PS and N-type SRAM region NS, followed by etching, thereby removing the compressive stress applying insulating film 55 from the N-type logic region NL, P-type SRAM region PS and N-type SRAM region NS. At this time, the second low stress applying insulating film 62 functions as an etch stopper in the P-type and N-type SRAM regions PS and NS so that the first low stress applying insulating film 61 remains unetched.

In the step shown in FIG. 11B, the third mask 57 is removed.

In the step shown in FIG. 12A, an interlayer insulating film 3 made of an oxide film is formed on the entire surface of the substrate. Then, the interlayer insulating film 3, tensile stress applying insulating film 50, compressive stress applying insulating film 55 and first and second low stress applying insulating films 61 and 62 are subjected to lithography and etching to form contact holes 4a and a shared contact hole 5a reaching the silicide layers 17, 27, 37, 47 and 77.

In the step shown in FIG. 12B, buried contact electrodes 4 and a shared contact electrode 5 are formed in the contact holes 4a and the shared contact hole 5. The buried contact electrodes 4 and the shared contact electrode 5 are made of a combination of a barrier film made of TiN and a metal film made of tungsten, for example. Through these steps, the semiconductor device of the present embodiment is fabricated.

In the semiconductor device of the present embodiment, the gate electrode 12 and the N-type source/drain regions (active regions) 16 in the N-type logic region NL are covered with the tensile stress applying insulating film 50. This structure improves the performance (drive capability) of the N-channel logic MIS transistors in the N-type logic region NL. In the P-type logic region PL, the gate electrode 22 and the P-type source/drain regions (active regions) 26 are covered with the compressive stress applying insulating film 55. This structure improves the performance (drive capability) of the P-channel logic MIS transistors in the P-type logic region PL.

Further, the gate electrode 32 and the P-type source/drain regions (active regions) 36 in the P-type SRAM region PS and the gate electrode 42 and the N-type source/drain regions (active regions) 46 in the N-type SRAM region NS are covered with a layered film including the first low stress applying insulating film 61 and the second low stress applying insulating film 62. In this case, stress applied to the active regions in the P-type and N-type SRAM regions PS and NS is lower than the stress applied by the tensile or compressive stress applying insulating film to the active regions in the logic regions PL and NL. As a result, the performance of N-channel SRAM MIS transistors in the N-type SRAM region NS and that of P-channel SRAM MIS transistors in the P-type SRAM region PS become almost equal. Thus, if the N-type MIS transistors and the P-type MIS transistors in the SRAM regions are arranged close to each other and it is difficult to cover the transistors with different films, the MIS transistors in both of the SRAM regions are kept in balance.

According to the method for manufacturing the semiconductor device of the present embodiment, in the step of etching the interlayer insulating film 3 made of an oxide film to form the contact holes 4a and the shared contact hole 5a as shown in FIG. 12A, the tensile stress applying insulating film 50, compressive stress applying insulating film 55 and low stress applying insulating film 60, which are made of nitride films, function as etch stoppers. As a result, the offset sidewalls 73a and the sidewalls 73b are prevented from being etched during the etching of the interlayer insulating film 3. Further, in the formation of the contact holes 4a and the shared contact hole 5a, the etch amount of the tensile stress applying insulating film 50, compressive stress applying insulating film 55 and first low stress applying insulating film 61 is small. Therefore, the amount of the offset sidewalls 73a and the sidewalls 73b etched at the same time is reduced. Thus, as compared with the prior art method in which the first low stress applying insulating film 61 is not formed, the sidewalls 73a and 73b are prevented from being reduced by etching and the occurrence of junction leakage at the P-type source/drain regions 36 is prevented.

According to the method for manufacturing the semiconductor device of the present embodiment, in the step of removing the tensile stress applying insulating film 50 made of a nitride film as shown in FIG. 10A, the first low stress applying insulating film 61 is covered with the second low stress applying insulating film 62 made of an oxide film. Therefore, the second low stress applying insulating film 62 functions as an etch stopper so that the first low stress applying insulating film 61 is not etched. In the same manner, in the step of removing the compressive stress applying insulating film 55 as shown in FIG. 11A, the second low stress applying insulating film 62 functions as an etch stopper so that the first low stress applying insulating film 61 is not etched.

In the first and second embodiments, the low stress applying insulating film, tensile stress applying insulating film and compressive stress applying insulating film are made of silicon nitride films by changing the deposition method and deposition condition. For example, to form a low tensile stress applying silicon nitride film and a tensile stress applying silicon nitride film, LP-CVD is used and the total gas pressure is changed to give different tensile stresses to the two films. A higher total gas pressure makes the tensile stress higher. Further, to form a low compressive stress applying insulating film and a compressive stress applying insulating film, plasma CVD is used and the RF power is changed to give different compressive stresses to the two films. A higher RF power makes the compressive stress higher.

What is claimed is:

1. A semiconductor device comprising:
   a first MIS transistor of a first conductivity type including a first gate electrode which is formed above a first active region made of a semiconductor layer and first source/drain regions which are formed in parts of the first active region located at the sides of the first gate electrode;
   a second MIS transistor of a second conductivity type including a second gate electrode which is formed above a second active region made of the semiconductor layer and second source/drain regions which are formed in parts of the second active region located at the sides of the second gate electrode;
   a third MIS transistor of a first conductivity type including a third gate electrode which is formed above a third active region made of the semiconductor layer and third source/drain regions which are formed in parts of the third active region located at the sides of the third gate electrode;
   a single-layer first insulating film which covers the first gate electrode, the first active region, the second gate electrode and the second active region and applies first stress;
   a single-layer second insulating film which covers the third gate electrode and the third active region and applies second stress; and
   an interlayer insulating film which is formed above the first insulating film and the second insulating film, wherein the absolute value of the first stress of the first insulating film is smaller than the absolute value of the second stress of the second insulating film, and
   the interlayer insulating film is formed in contact with the second insulating film, and on the first gate electrode in the first active region and the second gate electrode in the second active region through the first insulating film.

2. The semiconductor device of claim 1, wherein the first MIS transistor and the second MIS transistor constitute an SRAM and the third MIS transistor is formed in a logic region.

3. The semiconductor device of claim 1 further comprising:
   a third insulating film which lies between the first insulating film and the interlayer insulating film and applies third stress, wherein
   the absolute value of the third stress of the third insulating film is smaller than the absolute value of the second stress of the second insulating film.

4. The semiconductor device of claim 1, wherein
   a gate wiring is formed at the side of one of the first source/drain regions and first sidewalls are formed on the side surfaces of the gate wiring,
   the first insulating film covers the first source/drain regions, the first sidewalls and the gate wiring and
   a first shared contact is formed to penetrate the interlayer insulating film and the first insulating film to reach the first source/drain regions, the first sidewalls and the gate wiring.

5. The semiconductor device of claim 1, wherein
   the first MIS transistor and the third MIS transistor are N-channel MIS transistors,
   the second MIS transistor is a P-channel MIS transistor,
   a gate wiring is formed at the side of one of the second source/drain regions and second sidewalls are formed on the side surfaces of the gate wiring,
   the first insulating film covers the second source/drain regions, the second sidewalls and the gate wiring,
   a second shared contact is formed to penetrate the interlayer insulating film and the first insulating film to reach the second source/drain regions, the second sidewalls and the gate wiring, and
   the second stress is tensile stress.

6. The semiconductor device of claim 1, wherein
   the third MIS transistor is an N-channel MIS transistor and the second stress is tensile stress.

7. The semiconductor device of claim 1 further comprising:
   a fourth MIS transistor including a fourth gate electrode which is formed above a fourth active region made of the semiconductor layer and fourth source/drain regions formed in parts of the fourth active region located at the sides of the fourth gate electrode; and
   a fourth insulating film which covers the fourth gate electrode and the fourth active region and applies fourth stress, wherein
   the fourth stress is applied in the direction opposite to the direction of the second stress and
   the absolute value of the first stress is smaller than the absolute value of the fourth stress.

8. The semiconductor device of claim 7, wherein the fourth MIS transistor is formed in a logic region.

9. The semiconductor device of claim 7, wherein the fourth MIS transistor is a P-channel MIS transistor and the fourth stress is compressive stress.

10. The semiconductor device of claim 1, wherein the third MIS transistor is a P-channel MIS transistor and the second stress is compressive stress.

11. The semiconductor device of claim 1, wherein a silicide layer is formed on the third gate electrode and the third source/drain regions.

12. The semiconductor device of claim 1, wherein the second insulating film is made of silicon nitride, and the second stress is tensile stress.

13. The semiconductor device of claim 1, wherein the second insulating film is made of silicon nitride, and the second stress is compressive stress.

14. The semiconductor device of claim 3, wherein the third stress is applied in an opposite direction to the second stress.

15. The semiconductor device of claim 1, wherein an absolute value of the first stress is half or less of an absolute value of the second stress.

* * * * *